US008980170B2

(12) United States Patent
Whitcomb et al.

(10) Patent No.: US 8,980,170 B2
(45) Date of Patent: *Mar. 17, 2015

(54) NANOWIRE PREPARATION METHODS, COMPOSITIONS, AND ARTICLES

(71) Applicant: Carestream Health, Inc., Rochester, NY (US)

(72) Inventors: David R. Whitcomb, Woodbury, MN (US); William D. Ramsden, Afton, MN (US); Doreen C. Lynch, Afton, MN (US)

(73) Assignee: Carestream Health, Inc., Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/326,951

(22) Filed: Jul. 9, 2014

(65) Prior Publication Data

US 2014/0322069 A1 Oct. 30, 2014

Related U.S. Application Data

(63) Continuation of application No. 14/035,036, filed on Sep. 24, 2013, now Pat. No. 8,815,150, and a continuation of application No. 13/326,356, filed on Dec. 15, 2011, now Pat. No. 8,613,887.

(60) Provisional application No. 61/432,615, filed on Jan. 14, 2011, provisional application No. 61/488,811, filed on May 23, 2011, provisional application No. 61/488,814, filed on May 23, 2011, provisional application No. 61/500,155, filed on Jun. 23, 2011.

(51) Int. Cl.
| | |
|---|---|
| *C22C 1/00* | (2006.01) |
| *B22F 9/00* | (2006.01) |
| *B22F 1/00* | (2006.01) |
| *B22F 9/24* | (2006.01) |
| *C30B 29/60* | (2006.01) |
| *C30B 7/14* | (2006.01) |
| *C30B 29/02* | (2006.01) |
| *B22F 9/18* | (2006.01) |
| *C22C 5/06* | (2006.01) |
| *B82Y 40/00* | (2011.01) |
| *C22C 9/00* | (2006.01) |
| *B82Y 30/00* | (2011.01) |
| *C22C 5/02* | (2006.01) |

(52) U.S. Cl.
CPC .............. *B22F 9/00* (2013.01); *B22F 1/0025* (2013.01); *B22F 9/24* (2013.01); *B22F 2999/00* (2013.01); *C30B 29/60* (2013.01); *C30B 7/14* (2013.01); *C30B 29/02* (2013.01); *B22F 9/18* (2013.01); *C22C 5/06* (2013.01); *B82Y 40/00* (2013.01); *C22C 5/02* (2013.01); *C22C 9/00* (2013.01); *B82Y 30/00* (2013.01); *Y10S 72/711* (2013.01)
USPC ................ 420/590; 420/591; 72/711; 72/392

(58) Field of Classification Search
CPC ......... B22F 1/0025; B22F 9/24; C30B 29/02; C30B 29/60; C30B 7/14; B82Y 30/00
USPC .............................. 420/590, 591; 72/711, 392
See application file for complete search history.

(56) References Cited

U.S. PATENT DOCUMENTS

| | | |
|---|---|---|
| 2006/0235087 A1 | 10/2006 | Alexandridis et al. |
| 2008/0210052 A1 | 9/2008 | Allemand |
| 2009/0196788 A1 | 8/2009 | Wang et al. |
| 2010/0148132 A1 | 6/2010 | Jiang et al. |
| 2011/0048170 A1 | 3/2011 | Bhatia et al. |
| 2012/0040085 A1 | 2/2012 | Kojima et al. |

FOREIGN PATENT DOCUMENTS

| | | |
|---|---|---|
| JP | 2009-155674 | 7/2009 |
| JP | 2010-192738 | 9/2010 |
| WO | WO2008/073143 | 6/2008 |
| WO | WO2010/095498 | 8/2010 |

OTHER PUBLICATIONS

Younan Xia, et al., Shape-Controlled Synthesis of Metal Nanocrystals: Simple Chemistry Meets Complex Physics?, Angew. Chem. Int. Ed. 2009, 48, pp. 60-103.
B. Wiley et al., Polyol synthesis of silver nanoparticles: Use of chloride and oxygen to promote the formation of single-crystal, truncated cubes and tetrahedrons, vol. 4, Issue 9, pp. 1733-1739, Sep. 2004.
Kylee Korte et al., Rapid synthesis of silver nanowires through a CuCl- or $CuCl_2$-mediated polyol process, Journal of Materials Chemistry, 2008, vol. 18, pp. 437-441.
Jinting Jiu, et al., Preparation of Ag nanorods with high yield by polyol process, Mat. Chem. & Phys., 2009, 114, pp. 333-338.
Srichandana Nandikonda, Microwave Assisted Synthesis of Silver Nanorods, M.S. Thesis, Auburn University, Aug. 9, 2010, 59 pages.
Dapeng Chen et al., Large-scale synthesis of silver nanowires via a solvothermal methods, J. Mater Sci: Matter Electron, 2011, vol. 22, pp. 6-13.
Liangbing Hu et al., Scalable Coating and Properties of Transparent, Flexible, Silver Nanowire Electrodes, ACS Nano, vol. 4, No. 5, 2010, pp. 2955-2963.
Chang Chen et al., Study on the synthesis of silver nanowires with adjustable diameters through the polyol process, Nanotechnology, vol. 17, 2006, pp. 3933-3938.
Li Zhou, Crystal structure and optical properties of silver nanorings, Applied Physics Letters, vol. 94, No. 153102, 2009, 3 pages.
Shanthi Muralli et al., Lyotropic liquid crystalline self-assembly in dispersions of silver nanowires and nanoparticles, 2010, vol. 26, Issue 13, pp. 11176-11183.

(Continued)

*Primary Examiner* — Rebecca Lee
(74) *Attorney, Agent, or Firm* — Reed L. Christiansen

(57) ABSTRACT

Methods of producing metal nanowires, compositions, and articles are disclosed. Such methods allow production of metal nanowires with reproducibly uniform diameter and length, even in the presence of catalyst concentration variation. Such metal nanowires are useful for electronics applications.

6 Claims, 12 Drawing Sheets

(56) References Cited

OTHER PUBLICATIONS

Benjamin Wiley et al., Polyol Synthesis of Silver Nanostructures: Control of Product Morphology with Fe(II) or Fe(III) Species, Langmuir, The ACS Journal of Surfaces and Colloids, Aug. 2005, vol. 21, No. 18, pp. 8077-8080.

Z.C. Li, Sodium chloride assisted synthesis of silver nanowires, IET Micro & Nano Letters, vol. 6, Issue 2, pp. 90-93, Feb. 2011.

International Search Report, International Application No. PCT/US2011/065329, Apr. 5, 2012, 2 pages.

International Search Report, International Application No. PCT/US2012/029322, Apr. 27, 2012, 2 pages.

NANOWIRE PREPARATION METHODS, COMPOSITIONS, AND ARTICLES

CROSS REFERENCE TO RELATED APPLICATIONS

This application is a continuation of U.S. patent application Ser. No. 14/035,036, filed Sep. 24, 2013, which is a continuation of U.S. patent application Ser. No. 13/326,356, filed Dec. 15, 2011, entitled NANOWIRE PREPARATION METHODS, COMPOSITIONS, AND ARTICLES, now U.S. Pat. No. 8,613,887, which claimed the benefit of U.S. Provisional Application No. 61/432,615, filed Jan. 14, 2011, entitled NANOWIRE PREPARATION METHODS, COMPOSITIONS, AND ARTICLES; U.S. Provisional Application No. 61/488,811, filed May 23, 2011, entitled NANOWIRE PREPARATION METHODS, COMPOSITIONS, AND ARTICLES; U.S. Provisional Application No. 61/488,814, filed May 23, 2011, entitled NANOWIRE PREPARATION METHODS, COMPOSITIONS, AND ARTICLES; and U.S. Provisional Application No. 61/500,155, filed Jun. 23, 2011, entitled NANOWIRE PREPARATION METHODS, COMPOSITIONS, AND ARTICLES, each of which is hereby incorporated by reference in its entirety.

BACKGROUND

The general preparation of silver nanowires (10-200 aspect ratio) is known. See, for example, Angew. Chem. Int. Ed. 2009, 48, 60, Y. Xia, Y. Xiong, B. Lim, S. E. Skrabalak, which is hereby incorporated by reference in its entirety. Such preparations typically employ $Fe^{2+}$ or $Cu^{2+}$ ions to "catalyze" the wire formation over other morphologies. The controlled preparation of silver nanowires having desired lengths and widths, however, is not known. For example, the $Fe^{2+}$ produces a wide variety of lengths or thicknesses and the $Cu^{2+}$ produces wires that are too thick for many applications.

When iron or copper are used, they are typically provided as the metal halide salts $FeCl_2$ or $CuCl_2$. See, for example, B. Wiley et al., Nano Letters, 2004, 4, 1733-1739 and K. E. Korte et al., J. Mats. Chem., 2008, 18, 437. Other metal halide salts have been used in nanowire synthesis. See, for example, J. Jiu, K. Murai, D. Kim, K. Kim, K. Suganuma, Mat. Chem. & Phys., 2009, 114, 333, which refers to NaCl, $CoCl_2$, $CuCl_2$, $NiCl_2$ and $ZnCl_2$, and S. Nandikonda, "Microwave Assisted Synthesis of Silver Nanorods," M. S. Thesis, Auburn University, Auburn, Ala., USA, Aug. 9, 2010, which refers to NaCl, KCl, $MgCl_2$, $CaCl_2$, $MnCl_2$, $CuCl_2$, and $FeCl_3$. Use of KBr has been disclosed in, for example, D. Chen et al., J. Mater. Sci.: Mater. Electron., 2011, 22(1), 6-13; L. Hu et al., ACS Nano, 2010, 4(5), 2955-2963; and C. Chen et al, Nanotechnology, 2006, 17, 3933. Use of NaBr has been disclosed in, for example, L. Zhou et al., Appl. Phys. Letters, 2009, 94, 153102. See also S. Murali et al., Langmuir, 2010, 26(13), 11176-83; Z. C. Li et al., Micro & Nano Letters, 2011, 6(2), 90-93; and B. J. Wiley et al., Langmuir, 2005, 21, 8077.

Japanese patent application publication 2009-155674 discloses use of $SnCl_4$. U.S. patent application publication 2010/0148132 discloses use of NaCl, KCl, $CaCl_2$, $MgCl_2$, and $ZnCl_2$. U.S. patent application publications 2008/0210052 and 2011/0048170 disclose use of quaternary ammonium chlorides.

SUMMARY

At least a first embodiment provides methods comprising providing at least one compound capable of forming at least one halide ion, where the compound comprises at least one first atom, at least one halogen atom bonded to the at least one first atom, and at least one carbon atom bonded to the at least one first atom; and reducing at least one first metal ion to at least one first metal in the presence of at least one of the at least one compound or the at least one halide ion. In such methods, the absolute value of the difference in electronegativities of the at least one first atom and the at least one halogen atom may be greater than about 0.4 Pauling units and less than about 2.0 Pauling units.

In such methods, the at least one first atom may, for example, comprise at least one of a boron atom, a nitrogen atom, a phosphorus atom, a silicon atom, a sulfur atom, a selenium atom, or a carbon atom. Or, in some cases, the at least one first atom may comprise at least one of a boron atom, a phosphorus atom, a silicon atom, or a carbon atom.

In some cases, the at least one halide ion may, for example, comprise at least one chloride ion, bromide ion, or iodide ion. Or, in some cases, the at least one halide may comprise at least one chloride ion or bromide ion.

In at least some embodiments, the at least one compound may comprise at least one carbocation. For example, such a carbocation may be a primary carbocation, a secondary carbocation or a tertiary carbocation.

Non-limiting examples of the at least one compound are diethyldichlorosilane, phenylphosphonic dichloride, dichlorophenylborane, and triphenylchloromethane.

In at least some embodiments, such methods may further comprise forming the at least one first halide ion by solvolysis of the at least one compound. Solvolysis may, for example, comprise one or more of hydrolysis, alcoholysis, glycolysis, acidolysis, aminolysis, or ammonolysis.

In at least some cases, the at least one first metal may, for example, comprise at least one element from IUPAC Group 11 or at least one coinage metal. An exemplary at least one first metal is silver.

Other embodiments provide the at least one first metal produced by such methods. Still other embodiments provide nanowires comprising the at least one first metal produced by such methods.

At least a second embodiment provides methods comprising providing a composition comprising an amount of at least one organosilicon halide compound that is capable of forming at least one halide ion; and reducing at least one first metal ion to at least one first metal in the presence of the composition. The at least one organosilicon halide compound may, for example, comprise at least one silicon atom bonded to at least one halogen atom, or at least one silicon atom bonded to at least two halogen atoms. The at least one halide ion may, for example, comprise at least one chloride ion. The at least one first silver metal ion may, for example, comprise at least one element from IUPAC Group 11, or at least one coinage metal ion, or at least one silver ion. The at least one organosilicon halide compound may, for example, comprise a silicon atom bonded to at least one halogen atom, where the silicon atom is also bonded to at least one carbon atom, or it may comprise a silicon atom bonded to at least one halogen atom, where the silicon atom is also bonded to at least two carbon atoms, or it may, for example, comprise diethyldichlorosilane.

In at least some embodiments, such methods further comprise regulating the rate of halide generation by at least one of choosing the at least one organosilicon halide compound, selecting the amount of the at least one organosilicon halide compound in the composition, or selecting at least one temperature at which to perform the reduction.

Other embodiments further provide the at least one first metal product produced according to such embodiments. Such products may, for example, comprise at least one nanowire.

Still other embodiments further provide articles comprising the at least one first metal product produced according to such embodiments. Such articles may, for example, comprise electronic devices.

At least a third embodiment provides methods comprising providing a composition comprising at least one compound capable of forming at least one halide ion, where the compound comprises at least one of a boron atom, a nitrogen atom, a phosphorus atom, a sulfur atom, or a selenium atom; and reducing at least one first metal ion to at least one first metal ion the presence of the composition. The compound may, for example, comprise at least one first atom bonded to at least one halogen atom and to at least one carbon atom. Such a first atom may, for example, comprise at least one of a boron atom, a nitrogen atom, a phosphorus atom, a sulfur atom, or a selenium atom. An exemplary at least one compound is phenylphosphonic dichloride. In at least some embodiments, the at least one halide ion comprises at least one chloride ion. The at least one first metal ion may, for example, comprise at least one element from IUPAC Group 11, or at least one coinage metal ion, such as, for example, a silver ion.

In at least some embodiments, such methods may further comprise regulating the rate of halide generation by at least one of choosing the at least one compound, selecting the amount of the at least one compound in the composition, or selecting at least one temperature at which to perform the reduction.

In at least some embodiments, the reducing may occur in the presence of at least one second metal or metal ion that has an atomic number different from that of the at least one first metal ion.

Other embodiments provide the at least one first metal product produced by such methods. Such a product may, for example, comprise at least one nanowire.

Still other embodiments provide an article comprising the at least one first metal product produced by such methods.

At least a fourth embodiment comprises methods comprising providing an amount of at least one organo-halide compound, where the compound is capable of forming at least one carbocation and at least one halide ion and reducing the at least one first metal ion to at least one first metal in the presence of the composition.

In at least some embodiments, the at least one organo-halide compound may comprise a carbon atom bonded to at least one halogen atom, and also to at least one aromatic ring by at least one carbon-carbon bond. Or such a carbon atom may be bonded to at least one halogen atom, and also to at least two aromatic rings by at least two carbon-carbon bonds. Or such a carbon atom may be bonded to one halogen atom, and also to three aromatic rings by at three carbon-carbon bonds. Such a compound may, for example, comprise triphenylchloromethane.

In at least some embodiments, the at least one carbocation comprises at least one secondary carbocation or tertiary carbocation, or the at least one carbocation comprises at least one tertiary carbocation.

In some cases, the at least one halide ion comprises a chloride ion or a bromide ion, or the at least one halide ion comprises at least one chloride ion.

In at least some embodiments, such methods may further comprise regulating the rate of halide generation by at least one of choosing the at least one organo-halide compound, selecting the amount of the at least one organo-halide compound in the composition, or selecting at least one temperature at which to perform the reduction.

Other embodiments provide the at least one first metal product produced by such methods. Such a product may, for example, comprise at least one nanowire.

Still other embodiments provide an article comprising the at least one first metal product produced by such methods.

These embodiments and other variations and modifications may be better understood from the description of figures, figures, description, exemplary embodiments, examples, and claims that follow. Any embodiments provided are given only by way of illustrative example. Other desirable objectives and advantages inherently achieved may occur or become apparent to those skilled in the art. The invention is defined by the appended claims.

DESCRIPTION

Figure 1:
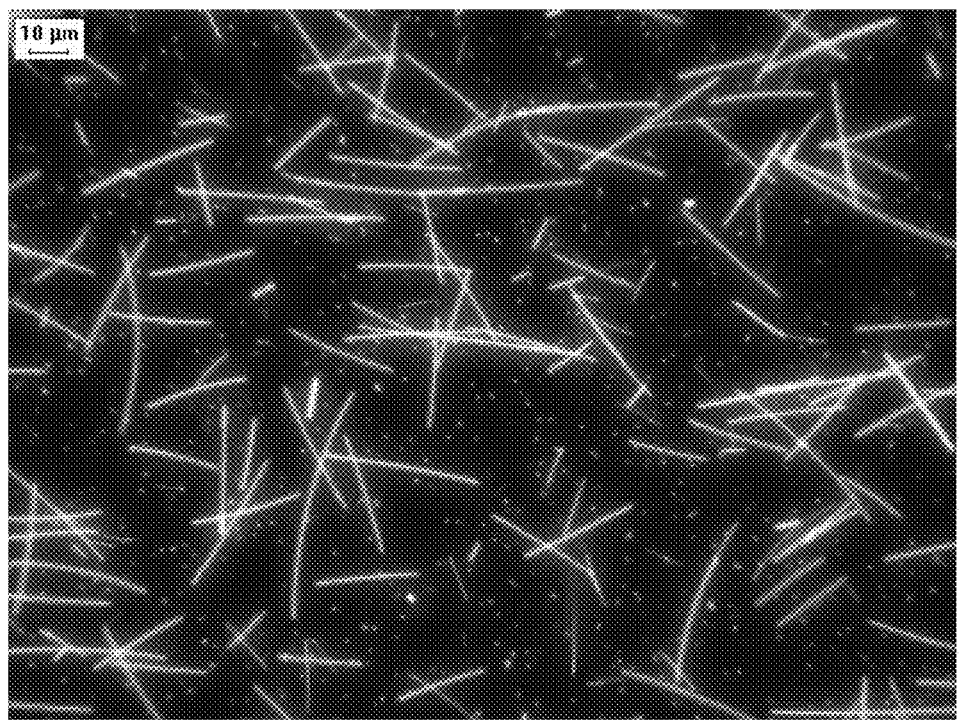
FIG. 1 shows an optical micrograph of the silver nanowire product of Example 1.

All publications, patents, and patent documents referred to in this document are incorporated by reference herein in their entirety, as though individually incorporated by reference.

U.S. patent application Ser. No. 13/326,356, filed Dec. 15, 2011, entitled NANOWIRE PREPARATION METHODS, COMPOSITIONS, AND ARTICLES; U.S. Provisional Application No. 61/432,615, filed Jan. 14, 2011, entitled NANOWIRE PREPARATION METHODS, COMPOSITIONS, AND ARTICLES; U.S. Provisional Application No. 61/488,811, filed May 23, 2011, entitled NANOWIRE PREPARATION METHODS, COMPOSITIONS, AND ARTICLES; U.S. Provisional Application No. 61/488,814, filed May 23, 2011, entitled NANOWIRE PREPARATION METHODS, COMPOSITIONS, AND ARTICLES; and U.S. Provisional Application No. 61/500,155, filed Jun. 23, 2011, entitled NANOWIRE PREPARATION METHODS, COMPOSITIONS, AND ARTICLES, are each hereby incorporated by reference in its entirety.

At least some embodiments provide methods employing at least one compound capable of forming at least one halide ion in the reduction of metal ions, where the reduction occurs in the presence of the at least one compound or the at least one halide ion. Such compounds comprise at least one first atom bonded to at least one carbon atom and to at least one halogen atom. The bond between the at least one first atom and the at least one halogen atom may be termed a "polar covalent" bond, which for this application is meant in the sense that the absolute value of the difference in electronegativities of the at least one first atom and the at least one halogen atom is greater than about 0.4 Pauling units and less than about 2.0 Pauling units. Such methods can allow production of, for example, metal nanowires that have reproducibly uniform thicknesses and lengths, even in the presence of run-to-run variability in the concentration of the at least one compound.

Metal Ions and Metal Products

Some embodiments provide methods comprising reducing metal ions to metal. Such metal ions may be referred to as "reducible metal ions," in the sense that that are capable of being reduced to a metal under some set of reaction conditions. In such methods, the metal ion may, for example, comprise at least one ion of an IUPAC Group 11 element or at least one coinage metal ion. A coinage metal ion is an ion of one or more of the coinage metals, which include copper, silver, and gold. Such metal ions may, in some cases, be provided as salts. For example, silver cations might, for example, be provided as silver nitrate.

In such embodiments, the at least one metal is that metal to which the at least one metal ion is capable of being reduced. For example, silver would be the metal to which a silver cation would be capable of being reduced.

Compounds Comprising Carbon(s), Halogen(s), and Polar Covalent Bond(s)

Some embodiments provide methods comprising reducing metal ions to metal in the presence of at least one compound or halide ion, where the compound comprises at least one first atom bonded to at least one carbon atom and to at least one halogen atom, where the bond between the at least one first atom and the at least one halogen atom is a "polar covalent" bond, which for this application is meant in the sense that the absolute value of the difference in electronegativities of the at least one first atom and the at least one halogen atom is greater than about 0.4 Pauling units and less than about 2.0 Pauling units.

Use of such compounds in the reduction of metal ions can allow the provision of halide ions without also providing catalyst metal cations or other nonprotic cations. In traditional nanowire synthesis methods, halide ions are provided with catalyst metal cations or other nonprotic cations in stoichiometric ratios governed by the identity of the halogen-bearing compounds. While not wishing to be bound by theory, it is believed that the presence of such cations can affect both the ability to form nanowires and the morphology of the nanowires that are formed. The methods and compositions of this application can instead provide metal nanowires that have reproducibly uniform thicknesses and lengths, even in the presence of run-to-run variability in the concentration of the at least one compound.

In such methods, the at least one first atom may, for example, comprise at least one of a boron atom, a nitrogen atom, a phosphorus atom, a silicon atom, a sulfur atom, a selenium atom, or a carbon atom. Or, in some cases, the at least one first atom may comprise at least one of a boron atom, a phosphorus atom, a silicon atom, or a carbon atom.

In some cases, the at least one halide ion may, for example, comprise at least one chloride ion, bromide ion, or iodide ion. Or, in some cases, the at least one halide may comprise at least one chloride ion or bromide ion.

Non-limiting examples of the at least one compound are diethyldichlorosilane, phenylphosphonic dichloride, dichlorophenylborane, and triphenylchloromethane.

Other non-limiting examples of the at least one compound are compounds with the following chemical formulae: $R_xSiX_y$, where x+y=4 and y is non-zero; compounds $R_xBX_y$, where x+y=3 and y is not zero; borazines $R_xB_3N_3X_y$, where x+y=3 and y is non-zero; $R_xPX_y$, where x+y=3 and y is non-zero; $R_xPOX_y$, where x+y=3 and y is non-zero; acid halides RCOX; $R_xCX_y$, where x+y=4 and y is non-zero; and $R_xH_zCX_y$, where x+y+z=4, and x and y are non-zero. In these formulae, X represents a halogen atom and R represents an alkyl group, a substituted alkyl group, an aryl group, or a substituted aryl group. Substituted alkyl or aryl groups may comprise halogens, alkoxy moieties, amines, and the like.

In at least some embodiments, the at least one compound may be capable of forming at least one carbocation and at least one halide ion. Such a compound may, for example, comprise a carbon atom bonded to at least one halogen atom, and also to at least one aromatic ring by at least one carbon-carbon bond; or the compound may, for example, comprise a carbon atom bonded to at least one halogen atom, and also to at least two aromatic rings by at least two carbon-carbon bonds; or the compound may, for example, comprise a carbon atom bonded to one halogen atom, and also to three aromatic rings by at three carbon-carbon bonds. In some cases, such a carbocation may comprise at least one secondary carbocation or tertiary carbocation, or the at least one carbocation comprises at least one tertiary carbocation. Such a compound may, for example, comprise triphenylchloromethane.

Solvolysis

In at least some embodiments, such methods may further comprise forming the at least one first halide ion by solvolysis of the at least one compound. Solvolysis is a type of nucleophilic substitution where the nucleophile is a solvent molecule. Solvolyis may, for example, comprise one or more of hydrolysis, alcoholysis, glycolysis, acidolysis, aminolysis, or ammonolysis.

In some embodiments, solvolysis may be performed in a reaction mixture that may, for example, comprise one or more polyols, such as, for example, ethylene glycol, propylene glycol, butanediol, glycerol, sugars, carbohydrates, and the like.

Solvolysis of the at least one compound can provide halide ions without simultaneously introducing catalyst metal ions or other nonprotic cations. Without wishing to be bound by theory, it is believed that solvolysis of the polar covalent bond between the at least one first atom and at least one halogen atom results in production of a halide ion and a proton or protic cation.

By removing the traditional stoichiometric linkage between halide ions and nonprotic cations, it is possible to reduce metal ions in the presence of lowered nonprotic cation levels or even with little or no nonprotic cations being present.

Nanostructures, Nanostructures, Nanowires, and Articles

In some embodiments, the metal product formed by such methods is a nanostructure, such as, for example, a one-dimensional nanostructure. Nanostructures are structures having at least one "nanoscale" dimension less than 300 nm. Examples of such nanostructures are nanorods, nanowires, nanotubes, nanopyramids, nanoprisms, nanoplates, and the like. "One-dimensional" nanostructures have one dimension that is much larger than the other two nanoscale dimensions, such as, for example, at least about 10 or at least about 100 or at least about 200 or at least about 1000 times larger.

Such one-dimensional nanostructures may, in some cases, comprise nanowires. Nanowires are one-dimensional nanostructures in which the two short dimensions (the thickness dimensions) are less than 300 nm, preferably less than 100 nm, while the third dimension (the length dimension) is greater than 1 micron, preferably greater than 10 microns, and the aspect ratio (ratio of the length dimension to the larger of the two thickness dimensions) is greater than five. Nanowires are being employed as conductors in electronic devices or as elements in optical devices, among other possible uses. Silver nanowires are preferred in some such applications.

Such methods may be used to prepare nanostructures other than nanowires, such as, for example, nanocubes, nanorods, nanopyramids, nanotubes, and the like. Nanowires and other nanostructure products may be incorporated into articles, such as, for example, electronic displays, touch screens, portable telephones, cellular telephones, computer displays, laptop computers, tablet computers, point-of-purchase kiosks, music players, televisions, electronic games, electronic book readers, transparent electrodes, solar cells, light emitting diodes, other electronic devices, medical imaging devices, medical imaging media, and the like.

Preparation Methods

A common method of preparing nanostructures, such as, for example, nanowires, is the "polyol" process. Such a process is described in, for example, *Angew. Chem. Int. Ed.* 2009, 48, 60, Y. Xia, Y. Xiong, B. Lim, S. E. Skrabalak, which is hereby incorporated by reference in its entirety. Such processes typically reduce a metal cation, such as, for example, a silver cation, to the desired metal nanostructure product, such as, for example, a silver nanowire. Such a reduction may be carried out in a reaction mixture that may, for example, comprise one or more polyols, such as, for example, ethylene glycol (EG), propylene glycol, butanediol, glycerol, sugars, carbohydrates, and the like; one or more protecting agents, such as, for example, polyvinylpyrrolidinone (also known as polyvinylpyrrolidone or PVP), other polar polymers or copolymers, surfactants, acids, and the like; and one or more metal ions. These and other components may be used in such reaction mixtures, as is known in the art. The reduction may, for example, be carried out at one or more temperatures from about 120° C. to about 190° C., or from about 80° C. to about 190° C.

EXEMPLARY EMBODIMENTS

U.S. Provisional Application No. 61/432,615, filed Jan. 14, 2011, entitled NANOWIRE PREPARATION METHODS, COMPOSITIONS, AND ARTICLES, which is hereby incorporated by reference in its entirety, disclosed the following fourteen non-limiting exemplary embodiments:

A. A method comprising:
providing a composition comprising an amount of at least one organosilicon halide compound, said compound capable of forming at least one halide ion; and
reducing at least one first metal ion to at least one first metal in the presence of the composition.

B. The method according to embodiment A, wherein the at least one organosilicon halide compound comprises at least one silicon atom bonded to at least one halogen atom.

C. The method according to embodiment A, wherein the at least one organosilicon halide compound comprises at least one silicon atom bonded to at least two halogen atoms.

D. The method according to embodiment A, wherein the at least one halide ion comprises at least one chloride ion.

E. The method according to embodiment A, wherein the at least one first metal ion comprises at least one element from IUPAC Group 11.

F. The method according to embodiment A, wherein the at least one first metal ion comprises at least one coinage metal ion.

G. The method according to embodiment A, wherein the at least one first metal ion comprises at least one silver ion.

H. The method according to embodiment A, wherein the at least one organosilicon halide compound comprises a silicon atom bonded to at least one halogen atom, said silicon atom being also bonded to at least one carbon atom.

J. The method according to embodiment A, wherein the at least one organosilicon halide compound comprises a silicon atom bonded to at least one halogen atom, said silicon atom being also bonded to at least two carbon atoms.

K. The method according to embodiment A, wherein the at least one organosilicon halide compound comprises diethyldichlorosilane.

L. The method according to embodiment A, further comprising regulating the rate of halide generation by at least one of choosing the at least one organosilicon halide compound, selecting the amount of the at least one organosilicon halide compound in the composition, or selecting at least one temperature at which to perform the reduction.

M. At least one first metal product produced according to the method of embodiment A.

N. The at least one first metal product according to embodiment M, said at least one product comprising at least one nanowire.

P. An article comprising the at least one first metal product according to embodiment M.

U.S. Provisional Application No. 61/488,814, filed May 23, 2011, entitled NANOWIRE PREPARATION METHODS, COMPOSITIONS, AND ARTICLES, which is hereby incorporated by reference in its entirety, disclosed the following twelve non-limiting exemplary embodiments:

Q. A method comprising:
providing a composition comprising at least one compound capable of forming at least one halide ion, said compound comprising at least one of a boron atom, a nitrogen atom, a phosphorus atom, a sulfur atom, or a selenium atom; and
reducing at least one first metal ion to at least one first metal in the presence of the composition.

R. The method according to embodiment Q, wherein the compound comprises at least one first atom bonded to at least one halogen atom and to at least one carbon atom.

S. The method according to embodiment R, wherein the at least one first atom comprises at least one of a boron atom, a nitrogen atom, a phosphorus atom, a sulfur atom, or a selenium atom.

T. The method according to embodiment Q, wherein the at least one compound comprises phenylphosphonic dichloride.

U. The method according to embodiment Q, wherein the at least one halide ion comprises at least one chloride ion.

V. The method according to embodiment Q, wherein the at least one first metal ion comprises at least one element from IUPAC Group 11.

W. The method according to embodiment Q, wherein the at least one first metal ion comprises at least one coinage metal ion.

X. The method according to embodiment Q, wherein the at least one first metal ion comprises at least one silver ion.

Y. The method according to embodiment Q, further comprising:
regulating the rate of halide generation by at least one of choosing the at least one compound, selecting the amount of the at least one compound in the composition, or selecting at least one temperature at which to perform the reduction.

Z. The method according to embodiment Q, wherein the reducing occurs in the presence of at least one second metal or metal ion having an atomic number different from that of the at least one first metal ion.

AA. The at least one first metal product produced according to the method of embodiment Q.

AB. The at least one first metal product according to embodiment AA, said at least one product comprising at least one nanowire.

AC. An article comprising the at least one first metal product according to embodiment AA.

U.S. Provisional Application No. 61/500,155, filed Jun. 23, 2011, entitled NANOWIRE PREPARATION METHODS, COMPOSITIONS, AND ARTICLES, which is hereby incorporated by reference in its entirety, disclosed the following seventeen non-limiting exemplary embodiments:

AD. A method comprising:
 providing at least one compound comprising at least one first atom and at least one second atom, said at least one first atom comprising at least one atom from IUPAC Group 13 and said at least one second atom comprising at least one halogen atom; and
 reducing at least one first metal ion to at least one first metal in the presence of the at least one first atom.

AE. The method according to embodiment AD, wherein the at least one first metal ion comprises at least one coinage metal ion.

AF. The method according to embodiment AD, wherein the at least one first metal ion comprises at least one ion of an element from IUPAC Group 11.

AG. The method according to embodiment AD, wherein the at least one first metal ion comprises at least one silver ion.

AH. The method according to embodiment AD, wherein the at least one first atom comprises boron.

AJ. The method according to embodiment AD, wherein the at least one second atom comprises at least one of chlorine, bromine, or iodine.

AK. The method according to embodiment AD, wherein the at least one second atom comprises chlorine.

AL. The method according to embodiment AD, wherein the compound comprises at least one boron-carbon bond.

AM. The method according to embodiment AD, wherein the compound comprises at least one boron-halogen bond.

AN. The method according to embodiment AD, wherein the compound comprises at least one boron-carbon bond and at least one boron-halogen bond.

AP. The method according to embodiment AD, wherein the compound comprises dichlorophenylborane.

AQ. The method according to embodiment AD, wherein the reduction is carried out in the presence of the at least one second atom.

AR. The method according to embodiment AD, wherein the reduction is carried out in the presence of one or more of a protecting agent or a polyol.

AS. The at least one first metal according to embodiment AD.

AT. At least one article comprising the at least one first metal according to embodiment AS.

AU. The article according to embodiment AT, wherein the at least one first metal comprises one or more nanowires, nanocubes, nanorods, nanopyramids, or nanotubes.

AV. The article according to embodiment AT comprising at least one of an electronic display, a touch screen, a portable telephone, a cellular telephone, a computer display, a laptop computer, a tablet computer, a point-of-purchase kiosk, a music player, a television, an electronic game, an electronic book reader, a transparent electrode, a solar cell, a light emitting diode, an electronic device, a medical imaging device, or a medical imaging medium.

U.S. Provisional Application No. 61/488,811, filed May 23, 2011, entitled NANOWIRE PREPARATION METHODS, COMPOSITIONS, AND ARTICLES, which is hereby incorporated by reference in its entirety, disclosed the following fourteen non-limiting exemplary embodiments:

AW. A method comprising:
 providing a composition comprising an amount of at least one organo-halide compound, said compound capable of forming at least one carbocation and at least one halide ion; and
 reducing at least one first metal ion to at least one first metal in the presence of the composition.

AX. The method according to embodiment AW, wherein the at least one carbocation comprises at least one secondary carbocation or tertiary carbocation.

AY. The method according to embodiment AW, wherein the at least one carbocation comprises at least one tertiary carbocation.

AZ. The method according to embodiment AW, wherein the at least one halide ion comprises at least one chloride ion.

BA. The method according to embodiment AW, wherein the at least one first metal ion comprises at least one element from IUPAC Group 11.

BB. The method according to embodiment AW, wherein the at least one first metal ion comprises at least one coinage metal ion.

BC. The method according to embodiment AW, wherein the at least one first metal ion comprises at least one silver ion.

BD. The method according to embodiment AW, wherein the at least one organo-halide compound comprises a carbon atom bonded to at least one halogen atom, said carbon atom being also bonded to at least one aromatic ring by at least one carbon-carbon bond.

BE. The method according to embodiment AW, wherein the at least one organo-halide compound comprises a carbon atom bonded to at least one halogen atom, said carbon atom being also bonded to at least two aromatic rings by at least two carbon-carbon bonds.

BF. The method according to embodiment AW, wherein the at least one organo-halide compound comprises triphenylchloromethane.

BG. The method according to embodiment AW, further comprising:
 regulating the rate of halide generation by at least one of choosing the at least one organo-halide compound, selecting the amount of the at least one organo-halide compound in the composition, or selecting at least one temperature at which to perform the reduction.

BH. The at least one first metal product produced according to the method of embodiment AW.

BJ. The at least one first metal product according to embodiment BH, said at least one product comprising at least one nanowire.

BK. An article comprising the at least one first metal product according to embodiment BH.

EXAMPLES

Example 1

To a 500 mL reaction flask containing 280 mL ethylene glycol (EG), 0.20 g of a freshly prepared 52 mM solution of diethyldichlorosilane in EG and 3.3 g of a 3 mM solution of iron (II) acetylacetone in ethylene glycol (EG) were added.

The solution was stripped of at least some dissolved gases by bubbling N$_2$ into the solution for at least 2 hrs using a glass pipette at room temperature with mechanical stirring while at 100 rpm. (This operation will be referred to as "degassing" in the sequel.) Solutions of 0.77 M polyvinylpyrrolidinone (PVP, 55,000 weight-average molecular weight) in EG and 0.25 M AgNO$_3$ in EG were degassed with N$_2$, then 20 mL syringes of each were prepared. The reaction mixture was heated to 145° C. under N$_2$, then the AgNO$_3$ and PVP solutions were added at a constant rate over 25 minutes via a 12 gauge Teflon syringe needle. The reaction was held at 145° C. for 90 minutes then allowed to cool to ambient temperature.

An optical microscope picture of the silver nanowire product is shown in FIG. 1.

Example 2

A 500 mL reaction flask containing 280 mL ethylene glycol (EG) was degassed with N$_2$ using a TEFLON® fluoropolymer tube, while stirring at 100 rpm for 2 hours. To the EG was added 0.10 g of a freshly prepared 0.40 M solution of phenylphosphonic dichloride in EG and 3.3 g of a 3 mM solution of iron (II) acetylacetone in EG. The fluoropolymer tube was then retracted to provide nitrogen blanketing of the headspace of the reaction flask at a 0.5 L/min purge rate. Solutions of 0.84 M polyvinylpyrrolidinone (PVP, 55,000 weight-average molecular weight) in EG and 0.25 M AgNO$_3$ in EG were degassed with N$_2$, then 20 mL syringes of each were prepared. The reaction mixture was heated to 155° C. under N$_2$, then the AgNO$_3$ and PVP solutions were added at a constant rate over 25 minutes via a 12 gauge a TEFLON® fluoropolymer syringe needle. The reaction was held at 155° C. for 90 minutes, and then allowed to cool to ambient temperature.

Figure 2:
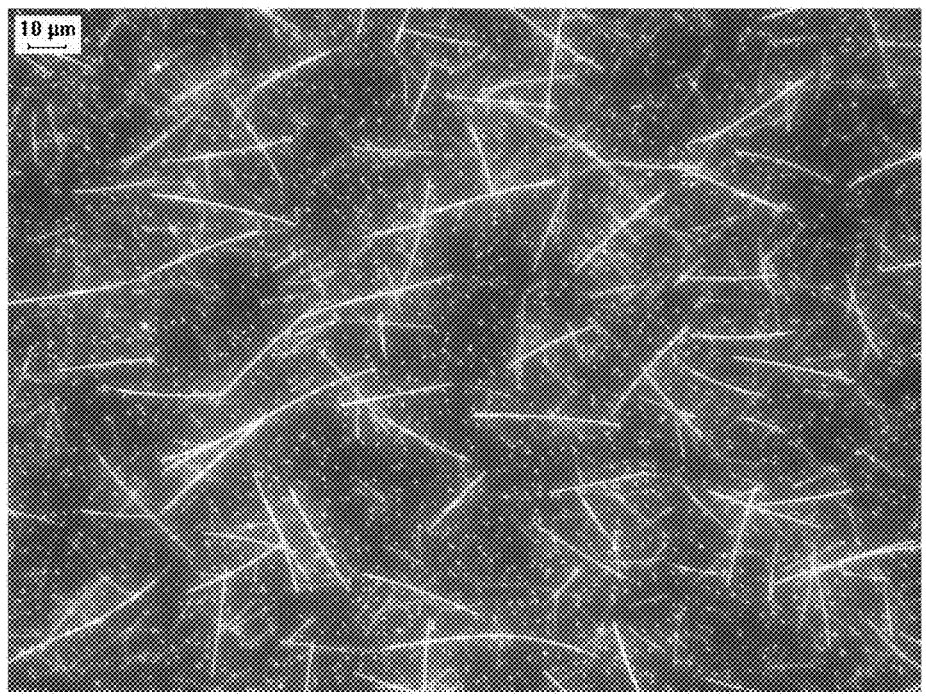
FIG. 2 shows an optical micrograph of the silver nanowire product of Example 2.

An optical microscope picture of the unpurified silver nanowire product is shown in FIG. 2.

Example 3

A 500 mL reaction flask containing 280 mL ethylene glycol (EG) was degassed overnight by bubbling nitrogen through its contents. To the flask, 1.3 g of freshly prepared 31 mM dichlorophenylborane in EG was added. The reaction mixture was heated to 145° C. under nitrogen. Stock solutions of 0.77 M polyvinylpyrrolidinone (PVP, 55,000 weight-average molecular weight) in EG and 0.25 M AgNO$_3$ in EG were degassed with nitrogen. 20 mL syringes of the PVP and AgNO$_3$ solutions were prepared and then added to the reaction flask at a constant rate over 25 min via a 12-gauge TEFLON® fluoropolymer syringe needle. The reaction mixture was held at 145° C. for 90 min, and was then allowed to cool to ambient temperature.

Figure 3:
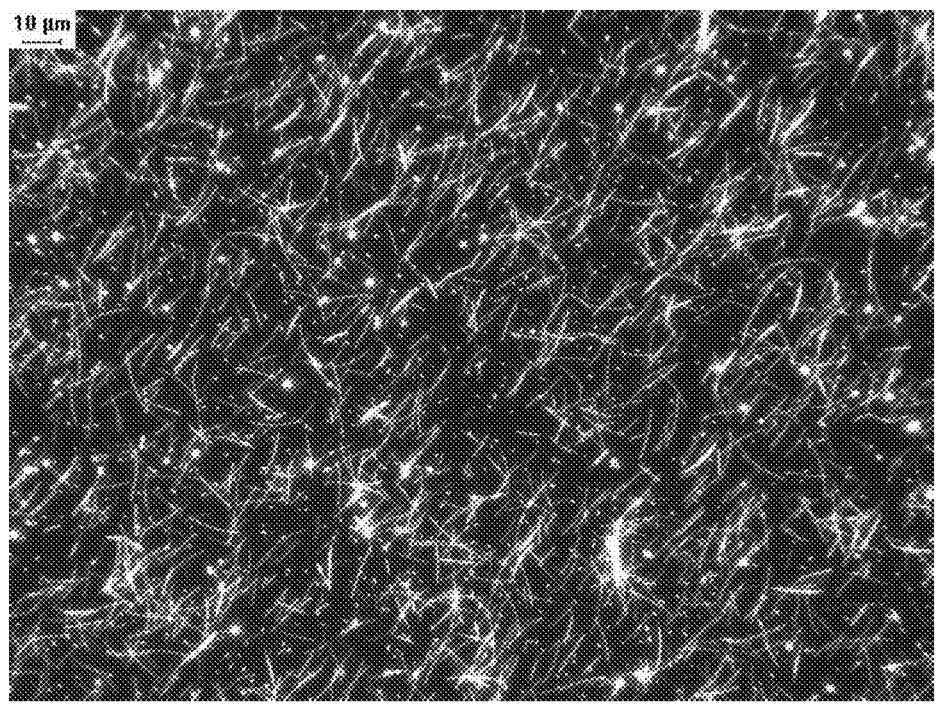
FIG. 3 shows an optical micrograph of the silver nanowire product of Example 3.

FIG. 3 shows an optical micrograph of the silver nanowire product.

Example 4

To a 500 mL reaction flask containing 280 mL ethylene glycol (EG), 2.5 g of a freshly prepared 81 mM solution of diethyldichlorosilane in EG was added. The solution was degassed by bubbling N$_2$ into the solution overnight using a TEFLON® fluoropolymer tube at room temperature with mechanical stirring while at 100 rpm. (This operation will be referred to as "degassing" in the sequel.) Solutions of 0.84 M polyvinylpyrrolidinone (PVP, 55,000 weight-average molecular weight) in EG and 0.25 M AgNO$_3$ in EG were degassed with N$_2$, then 20 mL syringes of each were prepared. The reaction mixture was heated to 145° C. under N$_2$, then the AgNO$_3$ and PVP solutions were added at a constant rate over 25 minutes via a 12 gauge TEFLON® fluoropolymer syringe needle. The reaction was held at 145° C. for 90 minutes then allowed to cool to ambient temperature.

Figure 4:
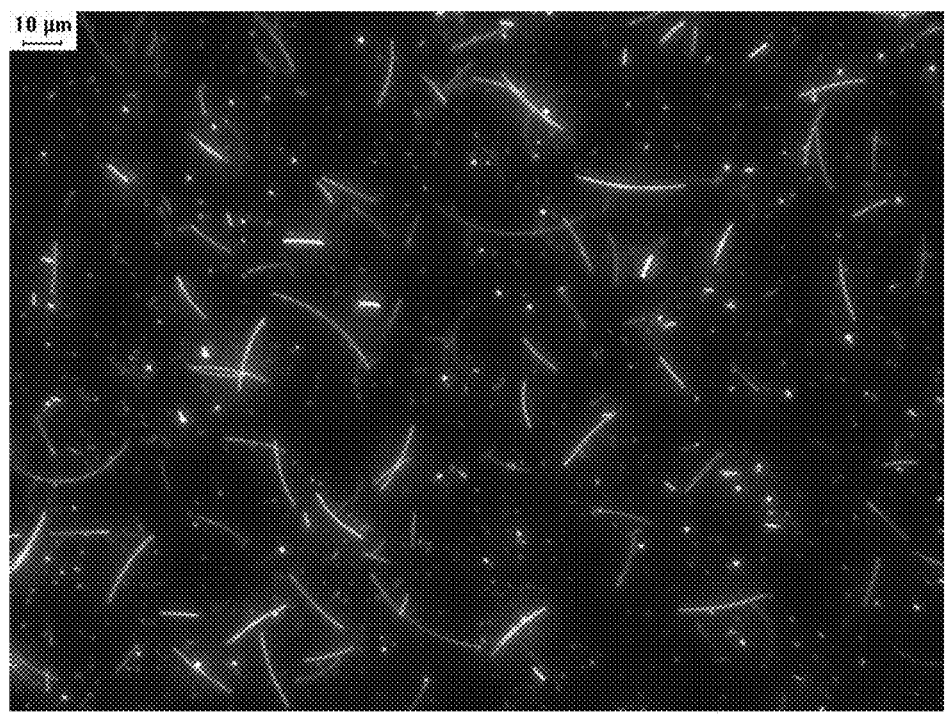
FIG. 4 shows an optical micrograph of the silver nanowire product of Example 4.

An optical microscope picture of the silver nanowire product is shown in FIG. 4. The nanowires had an average diameter of 64.9±16.5 nm and an average length of 15.5±μm, based on measurement of at least 100 wires.

Examples 5-7

The procedure of Example 4 was repeated, varying the amount and concentration of the diethyldichlorosilane/EG catalyst solution used. The results are shown in Table I, along with the results of Example 4. The average diameters and lengths varied minimally over the range of catalyst solutions that were tested.

Example 8

Comparative

To a 500 mL reaction flask was added 280 mL ethylene glycol (EG) and 1.4 g of a freshly prepared 15 mM IrCl$_3$.3H$_2$O dispersion in EG. This solution was degassed for 2 hrs by bubbling N$_2$ into the solution using a glass pipette at room temperature with mechanical stirring while at 100 rpm. Stock solutions of 0.25 M AgNO$_3$ in EG and 0.84 M polyvinylpyrrolidinone (PVP) in EG were also degassed by bubbling N$_2$ into the solutions for at least 60 minutes. Two syringes were loaded with 20 mL each of the AgNO$_3$ and PVP solutions. The reaction mixture was heated to 155° C. under N$_2$ and the AgNO$_3$ and PVP solutions were added at a constant rate over 25 minutes via 12 gauge TEFLON® fluoropolymer syringe needles. The reaction was held at 155° C. for 90 minutes then allowed to cool to room temperature.

Figure 5:
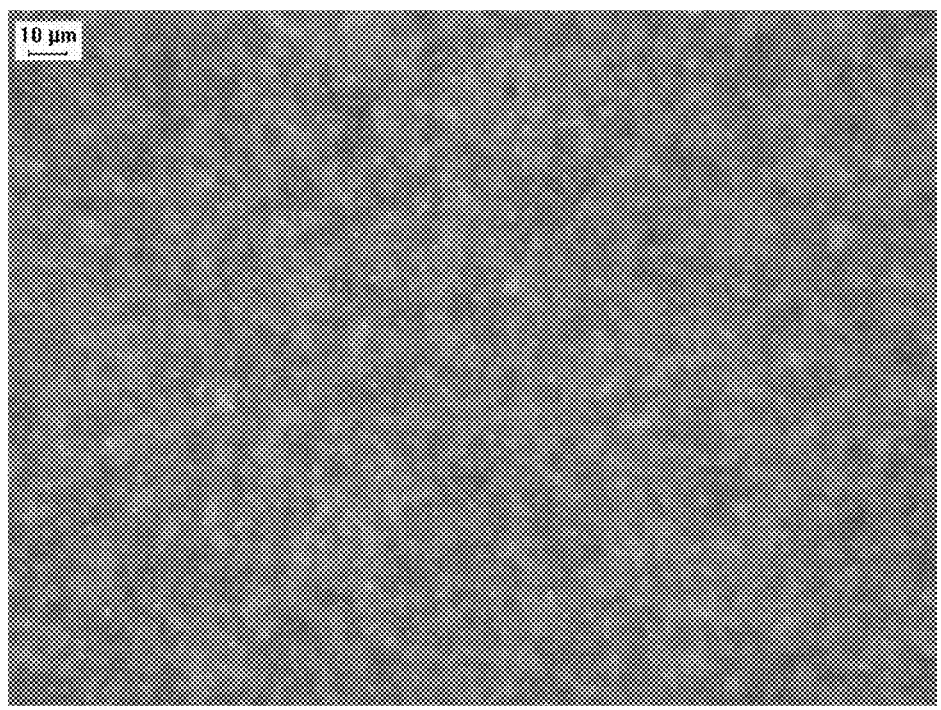
FIG. 5 shows an optical micrograph of the reaction product of comparative Example 8.

FIG. 5 shows the reaction mixture after 60 min of reaction. Visible are nanoparticles, microparticles, with only a few short nanowires.

Example 9

Comparative

The procedure of Example 8 was repeated, using 2.9 g of a freshly prepared 7.0 mM dispersion of K$_2$IrCl$_6$ in EG, instead of the IrCl$_3$.3H$_2$O dispersion. The reaction was carried out at 145° C., instead of 155° C.

Figure 6:
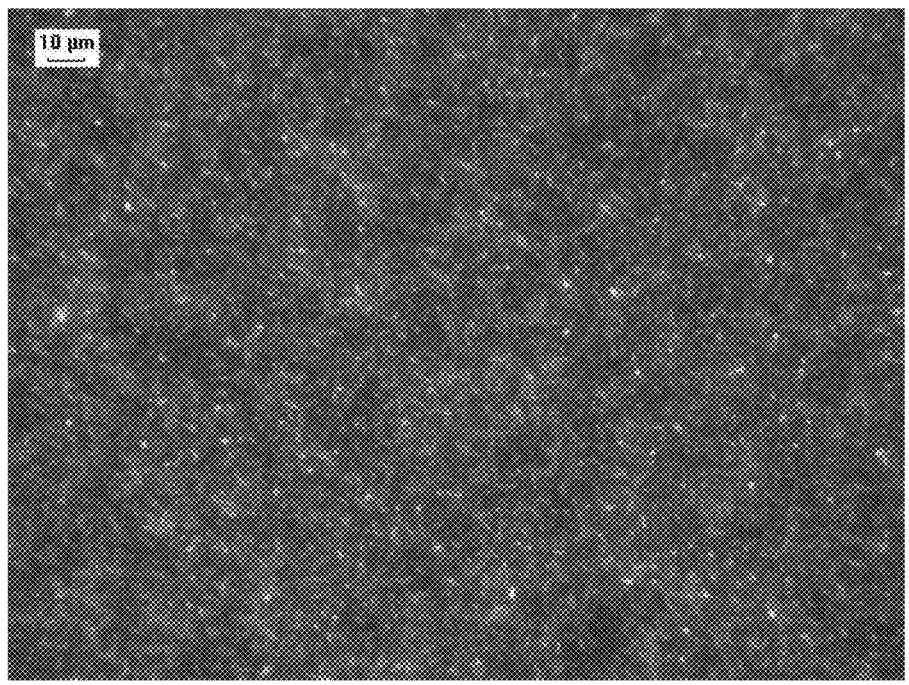
FIG. 6 shows an optical micrograph of the reaction product of comparative Example 9.

FIG. 6 shows the reaction mixture after 90 min of reaction. Only a few fine nanowires are visible.

Example 10

Comparative

The procedure of Example 8 was repeated, using 2.3 g of a freshly prepared 7.0 mM dispersion of InCl$_3$.4H$_2$O in EG, instead of the IrCl$_3$.3H$_2$O dispersion.

Figure 7:
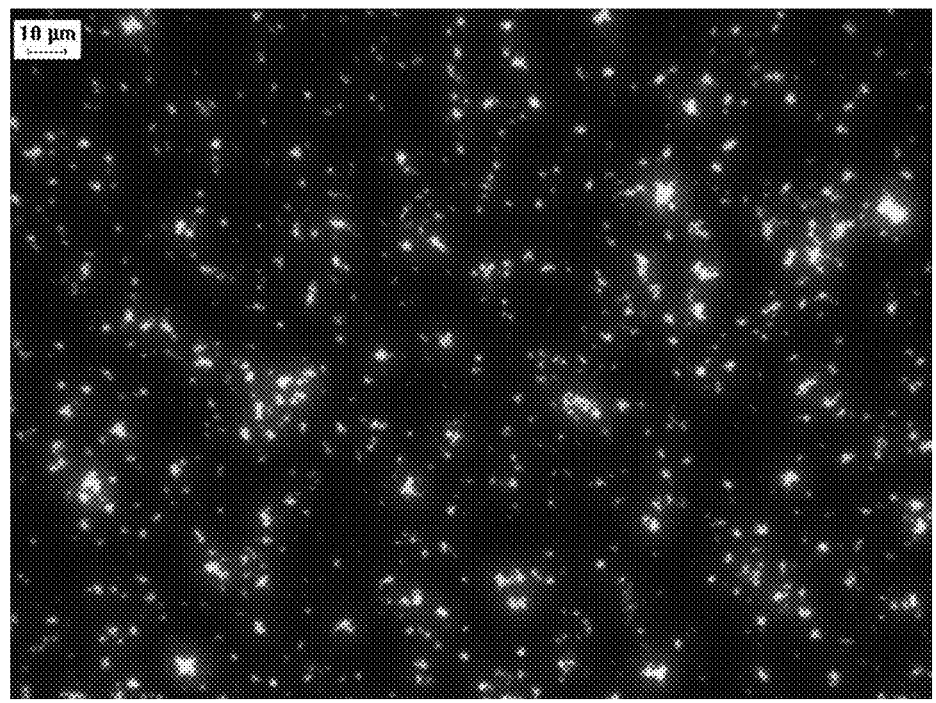
FIG. 7 shows an optical micrograph of the reaction product of comparative Example 10.

FIG. 7 shows the reaction mixture after 90 min of reaction. No nanowires are visible.

Example 11

Comparative

To a 100 mL reaction flask was added 50 mL ethylene glycol (EG) and 0.29 g of 7.0 mM AuCl$_3$ in EG. This solution was degassed for 2 hrs by bubbling N$_2$ into the solution using a glass pipette at room temperature with mechanical stirring while at 100 rpm. Stock solutions of 0.25 M AgNO$_3$ in EG and 0.84 M polyvinylpyrrolidinone (PVP) in EG were also degassed by bubbling $N_2$ into the solutions for at least 60 minutes. Two syringes were loaded with 3 mL each of the $AgNO_3$ and PVP solutions. The reaction mixture was heated to 145° C. under $N_2$ and the $AgNO_3$ and PVP solutions were added at a constant rate over 25 minutes via 20 gauge TEFLON® fluoropolymer syringe needles. The reaction was held at 145° C. for 150 minutes then allowed to cool to room temperature.

Samples taken after 15, 30, 60, 90, 120, and 150 min of reaction appeared to have only nanoparticles, but no nanowires.

Example 12

Comparative

A 500 mL reaction flask containing 300 mL ethylene glycol (EG), 2.2 g polyvinylpyrrolidinone (PVP, 55,000 weight-average molecular weight), and 9.2 mg of hafnium tetrachloride bis(tetrahydrofuran) adduct, was degassed overnight at room temperature using nitrogen that was introduced below the liquid surface through a TEFLON® fluoropolymer tube. The tube was then retracted from the liquid to provide nitrogen blanketing of the reaction flask headspace at approximately 0.5 L/min, after which the agitated flask was then heated to 145° C. A stock solution of 0.50 M $AgNO_3$ in EG was also degassed with nitrogen, and then a 20 mL syringe of the degassed solution was prepared. The $AgNO_3$ solution was then added at a constant rate over 25 min via a 12 gauge TEFLON® fluoropolymer syringe needle. The flask was then held at temperature for 60 min, after which it was allowed to cool down to ambient temperature.

Figure 8:
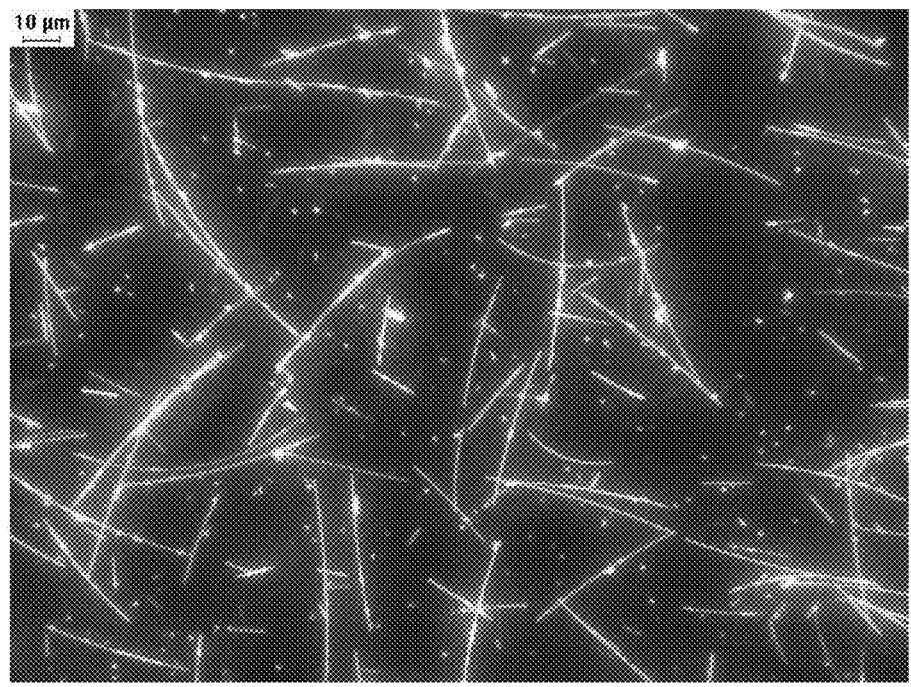
FIG. 8 shows an optical micrograph of the reaction product of comparative Example 12.

FIG. 8 shows an optical micrograph of the nanowire product, which had an average diameter of 253.5±133.0 nm and an average length of 8.7±5.5 µm, based on measurement of 100 wires.

Example 13

Comparative

Figure 9:
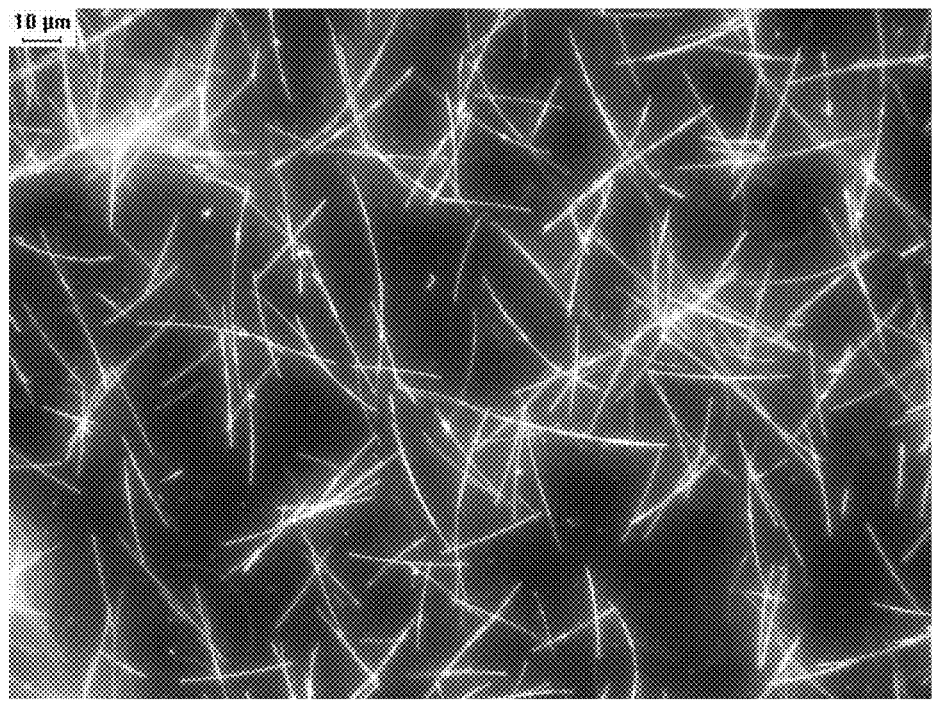
FIG. 9 shows an optical micrograph of the reaction product of comparative Example 13.

The procedure of Example 12 was repeated using 6.9 mg of zirconium tetrachloride bis(tetrahydrofuran) adduct in place of the hafnium-containing adduct. FIG. 9 shows an optical micrograph of the silver nanowire product, which had an average diameter of 147.3±50.0 nm and an average length of 15.6±12.0 µm, based on measurement of 100 wires.

Example 14

Comparative

Figure 10:
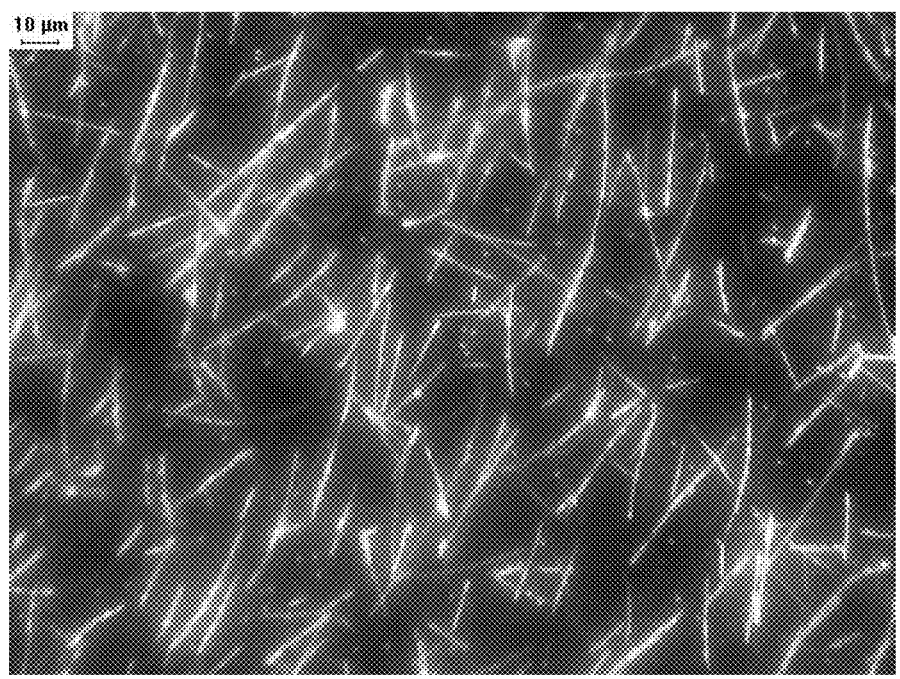
FIG. 10 shows an optical micrograph of the reaction product of comparative Example 14.

The procedure of Example 12 was repeated using 9.9 mg of tantalum (V) chloride. FIG. 10 shows an optical micrograph of the silver nanowire product, which had an average diameter of 215±119 nm and an average length of 10.6±6.5 µm, based on measurement of 100 wires.

Example 15

To a 500 mL reaction flask containing 280 mL ethylene glycol (EG), 7.3 mg of triphenylchloromethane and 3.3 g of a 3 mM solution of iron (II) acetylacetone in ethylene glycol (EG) were added. The reaction mixture was degassed with $N_2$ using a glass pipette while stirring at 100 rpm for 2 hours. Solutions of 0.77 M polyvinylpyrrolidinone (PVP) in EG and 0.25 M $AgNO_3$ in EG were degassed with $N_2$, then 20 mL syringes of each were prepared. The reaction mixture was heated to 155° C. under $N_2$, then the $AgNO_3$ and PVP solutions were added at a constant rate over 25 minutes via a 12 gauge TEFLON® fluoropolymer syringe needle. The reaction was held at 145° C. for 90 minutes then allowed to cool to ambient temperature.

Figure 11:
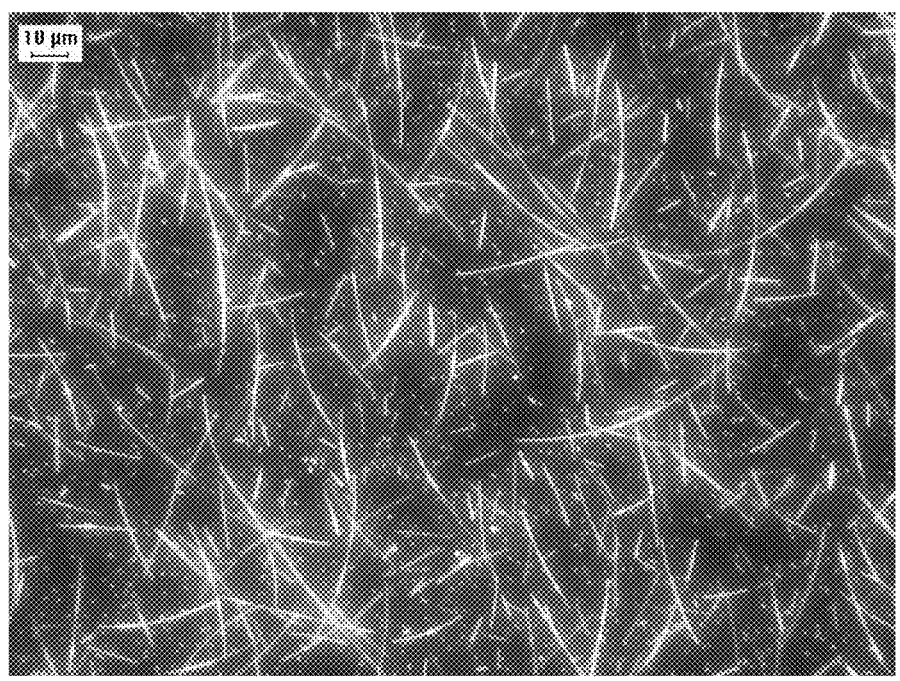
FIG. 11 shows an optical micrograph of the silver nanowire product of Example 15.

An optical micrograph of the silver nanowire product is shown in FIG. 11.

Example 16

The procedure of Example 15 was replicated, except for the use of 0.16 g of a freshly prepared 0.27 M solution of benzylchloride in EG in place of the triphenylchloromethane. Under these conditions, silver nanowires were observed to begin forming, however, irregularly-shaped silver nanowires then formed, which tended to agglomerate into clusters.

Figure 12:
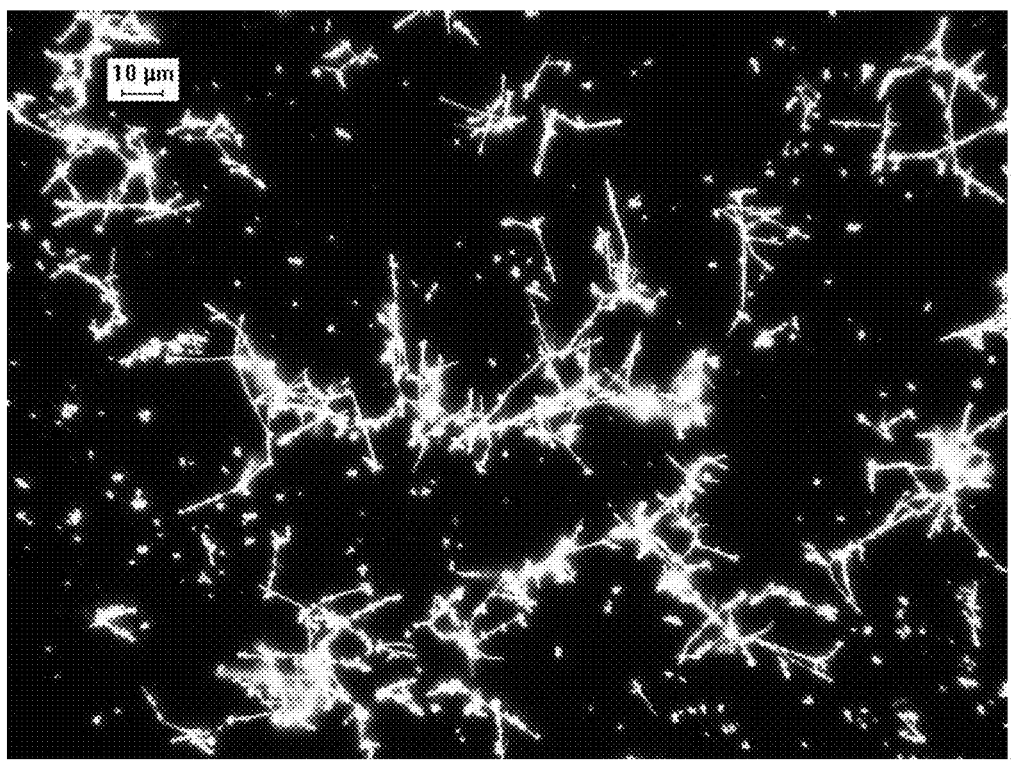
FIG. 12 shows an optical micrograph of the silver nanowire product of Example 16.

An optical microscope picture of the product from this reaction is shown in FIG. 12.

The invention has been described in detail with particular reference to a presently preferred embodiment, but it will be understood that variations and modifications can be effected within the spirit and scope of the invention. The presently disclosed embodiments are therefore considered in all respects to be illustrative and not restrictive. The scope of the invention is indicated by the appended claims, and all changes that come within the meaning and range of equivalents thereof are intended to be embraced therein.

TABLE I

| EXAMPLE | $Et_2SiCl_2$ Solution Used | Average Diameter (nm) | Average Length (µm) |
|---|---|---|---|
| 4 | 2.5 g of 0.81 mM | 65 | 16 |
| 5 | 5.0 g of 0.81 mM | 68 | 14 |
| 6 | 4.4 g of 0.45 mM | 62 | 14 |
| 7 | 1.0 g of 0.81 mM | 60 | 13 |

What is claimed:

1. A method comprising:
   providing at least one compound capable of forming at least one halide ion, said compound comprising at least one first atom, at least one halogen atom bonded to the at least one first atom, and at least one aromatic ring comprising at least one carbon atom bonded to the at least one first atom, the at least one first atom comprising at least one of a boron atom, a phosphorus atom, a silicon atom, a sulfur atom, or a selenium atom; and
   reducing at least one first metal ion to at least one first metal in the presence of at least one of the at least one compound or the at least one halide ion.

2. The method according to claim 1, further comprising forming the at least one halide ion by solvolysis of the at least one compound.

3. The method according to claim 1, wherein the at least one halide ion comprises at least one chloride ion or bromide ion.

4. The method according to claim 1, wherein the at least one compound is capable of forming at least one carbocation.

5. The method according to claim 1, wherein the at least one first metal comprises at least one element from IUPAC Group 11 or at least one coinage metal.

6. The method according to claim 1, wherein the at least one first metal comprises silver.

* * * * *